United States Patent [19]
Van Vaals

[11] Patent Number: 5,025,217
[45] Date of Patent: Jun. 18, 1991

[54] METHOD OF AND DEVICE FOR EDDY CURRENT COMPENSATION IN MR APPARATUS

[75] Inventor: Johannes J. Van Vaals, Eindhoven, Netherlands

[73] Assignee: U. S. Philips Corporation, New York, N.Y.

[21] Appl. No.: 404,913

[22] Filed: Sep. 8, 1989

[30] Foreign Application Priority Data

Sep. 8, 1988 [NL] Netherlands .......................... 8802212

[51] Int. Cl.⁵ ........................................... G01R 33/20
[52] U.S. Cl. .................................................. 324/322
[58] Field of Search ............... 324/300, 307, 309, 311, 324/312, 313, 314, 318, 319, 322, 320; 128/653 R, 653 A

[56] References Cited

U.S. PATENT DOCUMENTS

| | | | |
|---|---|---|---|
| 4,585,995 | 4/1986 | Flugan | 324/322 |
| 4,698,591 | 11/1987 | Glover et al. | 324/307 |
| 4,703,275 | 11/1987 | Holland | 324/318 |
| 4,743,851 | 5/1988 | Lim et al. | 324/309 |
| 4,761,612 | 8/1988 | Holland et al. | 324/307 |
| 4,950,994 | 8/1990 | Glover et al. | 324/320 |

OTHER PUBLICATIONS

Y. S. Kim and Z. H. Cho, "Eddy-Current-Compensated Field-Inhomogeneity Mapping in NMR Imaging," Journal of Magnetic Resonance, vol. 78 (1988), pp. 459-471.

*Primary Examiner*—Michael J. Tokar
*Attorney, Agent, or Firm*—William Squire

[57] ABSTRACT

In a magnetic resonance apparatus eddy current effects are compensated by measurement of the eddy current behaviour in a comparatively large measurement object on the basis of resonance signals generated therein, for example briefly after de-activation of a gradient field control signal. From these measurements a series of exponentially decreasing signals is calculated. These correction signals are generated by appropriate switching circuits which are preferably adjustable as regards decay time and amplitude. The correction can be performed for the gradient field symmetry corresponding to the switched gradient field transition as well as for eddy currents, if any, having a field symmetry which deviates therefrom.

16 Claims, 2 Drawing Sheets

METHOD OF AND DEVICE FOR EDDY CURRENT COMPENSATION IN MR APPARATUS

BACKGROUND OF THE INVENTION

The invention relates to a method of compensating eddy current effects in a magnetic resonance apparatus in which a signal for eddy current compensation is derived from a non-compensated gradient control signal, and also relates to an apparatus comprising means for eddy current compensation via gradient control signals.

A method and apparatus of this kind are known from EP No. 215 547 corresponding to U.S. Pat. No. 4,703,275 This document describes a method of eddy current compensation where the gradient field generated via a non-compensated gradient control is measured and compared with a desired gradient field, a signal being derived from the comparison in order to compensate the gradient field control signal. For carrying out this method it is necessary to include additional measurement coils in the apparatus or a gradient coil to be used for imaging must be suitable for performing the measurements. Additional measurement coils, however, themselves may have an effect on the eddy current behaviour and must be accurately positioned in the apparatus, and customary gradient coils produce comparatively inaccurate measurement results. Moreover, deviations from the desired gradient fields are also measured, while the consequences thereof for diagnostic measurements of resonance signals are of primary importance.

SUMMARY OF THE INVENTION

It is an object of the invention to eliminate these drawbacks. To achieve this, a method of the kind set forth in accordance with the invention is characterized in that correction signals are determined by measurement of rf resonance signals from a measurement object which occupies the space of a volume of interest within a measurement space of the apparatus, and in that these signals are compared with resonance signals obtained from corresponding measurements performed in the absence of a gradient field variation.

Because in accordance with the invention the correction signals are derived from rf resonance signals measured on a measurement object excited by a non-corrected gradient control signal and a customary rf pulse and occupying at least a large part of a volume of interest to be occupied at a later stage by an object to be examined, correction signals are obtained which are a direct measure of deviations to be corrected. No measurement coils need be included in the apparatus for performing the method in accordance with the invention; it is merely necessary to introduce a measurement object which is to be replaced by an object to be examined at a later stage. For adequate measurement it is not necessary to position this object exactly. An apparatus in accordance with the invention comprises electronic circuits and preferably memory for converting measured correction signals into compensating control signals for gradient control. Use is preferably made of circuits in which the magnitude and the time constant of correction control signals is adjustable. Switching circuits of this kind are known, for example from EP No. 215 547 and EP No. 164 199, which corresponds to U.S. Pat. No. 4,585,595.

It is to be noted that from U.S. Pat. No. 4,698,591 a method is known where correction signals are also derived from rf resonance signals; however, this method utilizes a small measurement object which is not centrally positioned within the apparatus. Consequently, it is not certain that the eddy current effects are also adequately compensated for in a space in the apparatus to be occupied by the object to be examined. Moreover, eddy current effects in directions other than the field direction of an applied gradient field are not corrected, so that correction is less complete. The signal analysis performed on phase measurements and the processing do not allow for higher-order correction and cross-correction. In accordance with the invention, however, after measurement of an eddy current behavior the latter corrections are also exactly calculated.

In a preferred version in accordance with the invention the non-compensated eddy current behavior is measured by measurement of the decay behavior of a temporal gradient field transition at the area of the measurement object by means of a rf resonance pulse generated at that area. In this respect activation as well as de-activation of a gradient field are feasible; measurement after de-activation, where resonance signals from the entire measurement object effectively contribute to the signal, may be attractive.

By measurement of the free induction decay, or echo measurements, of the resonance signals produced by the rf resonance pulse a direct measure of the eddy current effect disturbing the imaging is obtained. From these signals there is determined the magnitude of additional continuous gradient fields required to reduce an eddy current effect to less than an adjusted value, for example a period t after de-activation of a gradient field.

In a further preferred version, after analysis of the measured eddy current effects there is determined a series of control signals, control signals of corresponding value and decay time preferably being combined so as to form a single control signal. Moreover, from the measurements correction signals can be derived for eddy current effects in directions other than that of the gradient pulse causing the eddy currents. Even though it will often not be necessary because of the measurement method used, for further optimising of the detection the eddy current behavior of the compensating gradient field control signal can subsequently also be determined and from the analysis thereof there can be derived additional gradient field control signals for supply to the control devices for the gradient fields.

A magnetic resonance apparatus in accordance with the invention comprises, for example, a magnet system for generating a steady magnetic field, a coil system for generating gradient fields, an rf coil system for excitation and/or detection of magnetic resonance signals, and a control device for gradient coil control which comprises means for performing the described method. Preferably, the means comprise current control circuits which can be adapted to the amplitude and time constants of exponentially decreasing signals.

BRIEF DESCRIPTION OF THE DRAWING

Some preferred embodiments in accordance with the invention will be described in detail hereinafter with reference to the drawing. Therein.

DETAILED DESCRIPTION OF THE PREFERRED EMBODIMENTS

Figure 1:
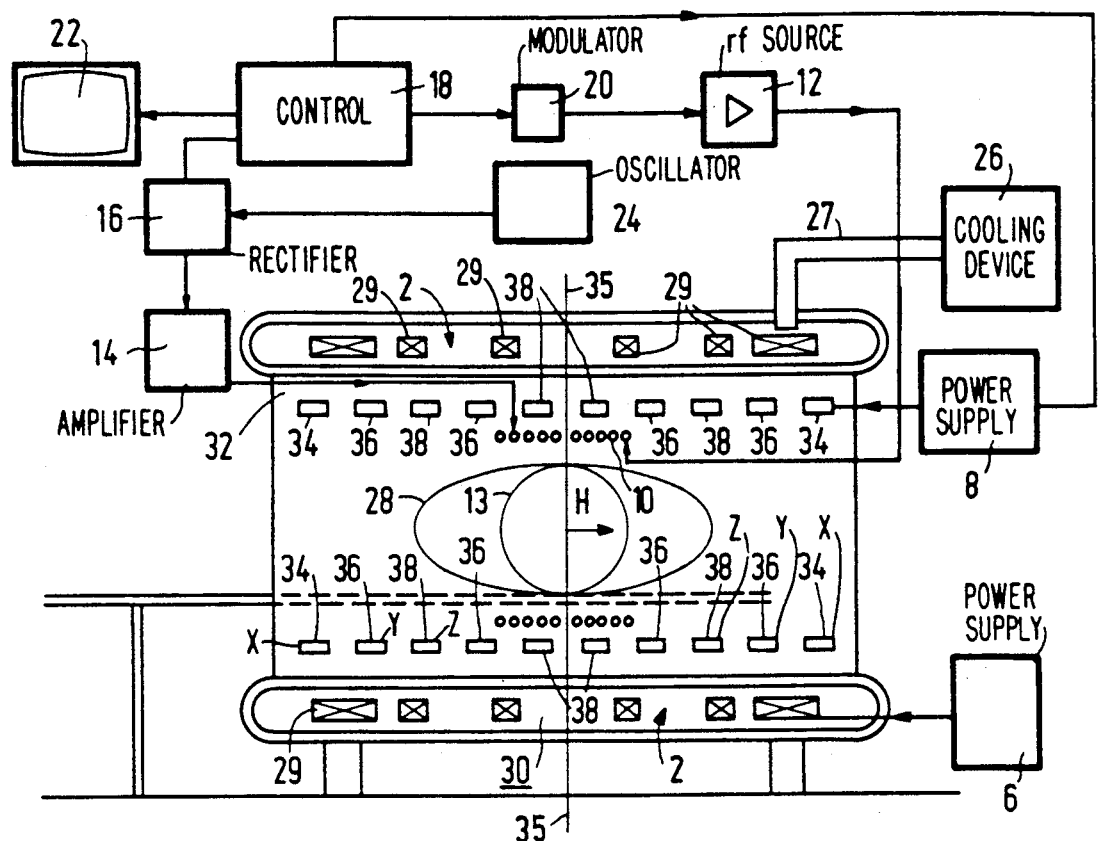
FIG. 1 shows a magnetic resonance apparatus comprising means for performing the method in accordance with the invention and FIGS. 2a, 2b and 2c show circuit diagrams of circuit for adjustable exponential control pulses forming part thereof.

A magnetic resonance apparatus as shown in FIG. 1 comprises a magnet system 2 for generating a steady, uniform magnetic field H, a magnet system 4 for generating magnetic gradient fields, and power supply sources 6 and 8 for the magnet system 2 and the magnet system 4, respectively. An rf magnet coil 10 serves to generate an rf alternating magnetic field; to this end it is connected to an rf source 12. For the detection of magnetic resonance signals generated by an rf transmitted field in an object to be examined or in a measurement object 13 use can also be made of the rf coil 10; to this end this coil is connected to a signal amplifier 14. The signal amplifier 14 is connected to a phase sensitive rectifier 16 which is connected to a central control device 18. The central control device 18 also controls a modulator 20 for the rf source 12, the power supply source 8 for the gradient coils and a monitor 22 for display. An rf oscilator 24 controls the modulator 20 as well as the phase-sensitive rectifier 16 which processes the measurement signals. For cooling, if any, of the magnet coils 2 for the main field there is provided a cooling device 26 which comprises cooling ducts 27. Such a cooling device may be constructed as a water cooling system for resistive coils or, in the case of high field strengths, for example as a liquid nitrogen and/or helium cooling system for superconducting magnet coils. The transmitter coil 10 which is arranged within the magnet systems 2 and 4 encloses a measuring space 28 which is spacious enough to accommodate patients to be examined in an apparatus for medical diagnostic measurements. Thus, in the measuring space 28 a uniform magnetic field H, gradient fields which select slices of the object, and a spatially uniform rf alternating field can be generated. The rf coil 10 is assumed to combine the functions of transmitter coil and measuring coil. Alternatively, separate coils may be used for the two functions, for example, surface coils acting as measuring coils.

The coil system 2 for the steady field is in this case formed by six isoradial coils 29 which are accommodated as superconducting coils in a dewar vessel 30 for liquid nitrogen or helium which can be introduced therein from the cooling device 26. It is to be noted that the cooling device may be simply a storage vessel for liquid nitrogen or helium or a liquefier therefor. In the latter case the liquid evaporated in the dewar vessel is continuously cooled so that a closed cooling system is obtained. Around a helium dewar vessel, if any, there is customarily provided a casing filled with, for example, liquid nitrogen.

A gradient coil former 32 which supports the gradient coils 4 is arranged within the coils for the main field and hence within the dewar vessel in a customary manner. X-gradient coils 34, Y-gradient coils 36 and Z-gradient coils 38 are shown by way of example. The Z-gradient coils form, for example closed rings around the entire measuring space, the X-coils and Y-coils being constructed as saddle coils. An example of a gradient coil system is described, for example in EP No. 164 199 (U.S. Pat. No. 4,585,995).

When such an apparatus is used to make images of patients to be examined, distortions occur therein due to eddy current effects which are caused by activation and de-activation of the gradient fields. The eddy currents may occur, for example in walls of dewar vessels such as the vessel 30, in rf shields which are usually included in such apparatus, etc. The eddy currents counteract the appearance or elimination of the gradient fields, thus impeding a fast measuring process because optimum distortion-free images can be realized only when the gradient fields have assumed the desired shape. During spectroscopic examinations such blurring may occur that the diagnostic value of the spectra measured is lost. If measurement can take place only a comparatively long period of time after application of the desired gradient fields, a reduced signal-to-noise ratio and a reduced resolution must be accepted; this not only seriously delays an examination but the risk of occurrence of other defects such as movement artefacts becomes comparatively high and loss of contrast also occurs.

In accordance with the invention free induction decay or echo signals are measured from the measurement object 13, for example, employing a sphere which is made of a material sensitive to magnetic resonance and which is hollow or not. By way of example the measurements may be made at different instants after de-activation of a grain gradient field, for example the X-gradient field. The variation of the signals, i.e. in this case the time-dependent decay thereof, is compared with an ideal variation, i.e. the case where no gradient field is activated. From the data thus obtained there are derived correction signals which are necessary for controlling the gradient coils so as to compensate for the errors. When such a compensation has been realized, the correction signal itself may introduce a disturbing eddy current effect. This is because a correction signal may readily amount to approximately 40% of the nominal gradient control signal. If desired, an eddy current effect thus introduced can be measured again and from this measurement a correction signal can again be derived for control. This process may be repeated for as long as desired. The series of correction signals which thus exhibit an exponential variation which differs as regards magnitude and time constant can be realized in a known manner by means of appropriate switching circuits. For a suitable measurement and control method for eddy current effects reference is made to U.S. Pat. No. 4,698,591, notably to FIG. 4a. It is to be noted that the rf pulse to be used for this purpose need not necessarily be a 90° pulse. Analysis of the free induction decay signals is described therein with reference to FIGS. 4b, 5 and 6. Phase measurements are performed on the free induction decay signals, which itself can be accurately performed but for the purpose of the present invention, i.e. the realization of full compensation this method is too restricted. A control device for realizing exponential control signals is described with reference to FIG 8 which corresponds to FIG. 2a of the present patent application but which does not allow for independent adjustment of decay time and amplitude.

For example, when measurement takes place after a gradient field transition, for example the de-activation of a gradient field in the X-direction, first of all, correction signals are determined for the control of the X-gradient coil. If it appears that inadequate compensation is obtained, correction signals can also be determined for the Y-gradient field and the Z-gradient field which are applied to the power supply sources for the relevant coils. Phase measurements as proposed in U.S. Pat. No.

4,698,591 do not allow for higher order corrections and cross-corrections.

From a variety of correction signals which can thus be determined signals having a related magnitude and time constant can be combined for reasons of economy and a single switching circuit can be used for each of these packets of signals.

Figure 2A:
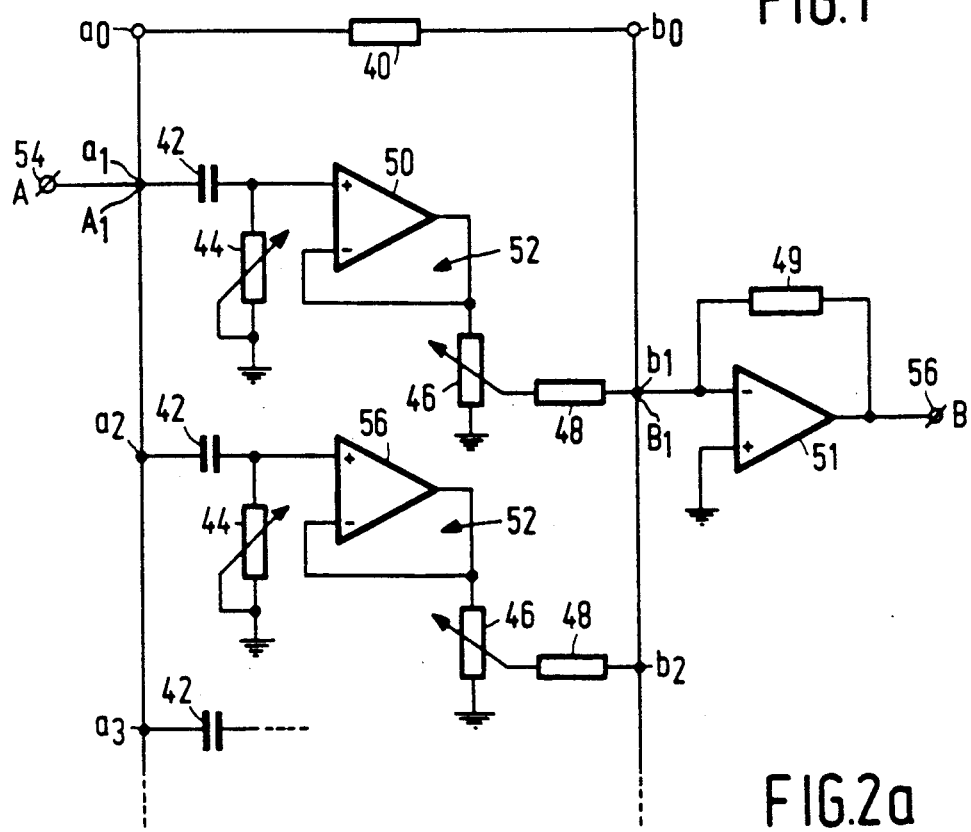
Figure 2B:
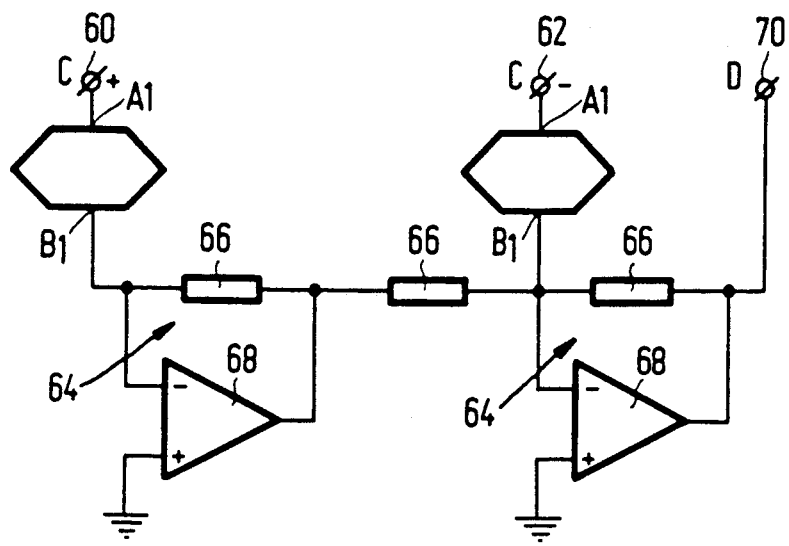

FIG. 2a shows an example of a circuit diagram of correction circuits whereby correction signals can be applied to the power supply source for the gradient coil system. The circuit diagram shows a series of filter circuits which are connected in parallel to a power supply resistance 40, each filter circuit comprising a capacitor 42, a variable resistor 44 which determines the decay time, a variable resistor 46 which determines the amplitude, a fixed resistor 48, and an operational amplifier 50. For such an exponential decay circuit the decay value is given by Rt. C, where Rt is the resistance of the resistor 44 and C is the capacitance of the capacitor 42. The amplitude of a correction signal is given by $$, Ra/Rmax \cdot Rv/Rc,$$

where Ra is the adjusted resistance of the resistor 46, Rmax is the maximum resistance thereof, Rv is the resistance of the supply resistor 40 and Rc is the resistance of the resistor 48. For example, Rv is 100 k$\Omega$, Ra is a variable resistor of 10 k$\Omega$, and Rc is dependent on the amplitude margin and amounts to from 250 to 1000 k$\Omega$. thus, for any decay time and amplitude a single correction circuit generates correction signals which correspond as regards decay time or amplitude. This circuit, the a number of correction circuits being equal to a desired number of different correction signals, is connected between an input terminal 54 (A) and an output terminal 56 (B) for a gradient control device. After measurement of eddy current effects on a measurement object arranged in the apparatus and after analysis of the measured data, the resistances of the various circuits can be adjusted for the desired time constant and amplitude. For control of the power supply system for another gradient coil system use can be made of a circuit as shown in FIG. 2b circuit comprises connected to an input terminal 60 (C) for a positive correction and to an input terminal 62 (C) for a negative correction, filter circuits A1-B1 as shown in FIG. 2a and a series of correction circuits 64 (in this case composed of power supply resistors 66 connected in series between the output B1 of amplifiers A1-B1 and the output terminal 70. Certain of the resistors 66 are bridged by an operational amplifier 68 forming circuits 64 for the sake of sensitivity). A circuit of this kind enables corrections based on eddy current effects to be performed for each direction of the gradient field.

Figure 2C:
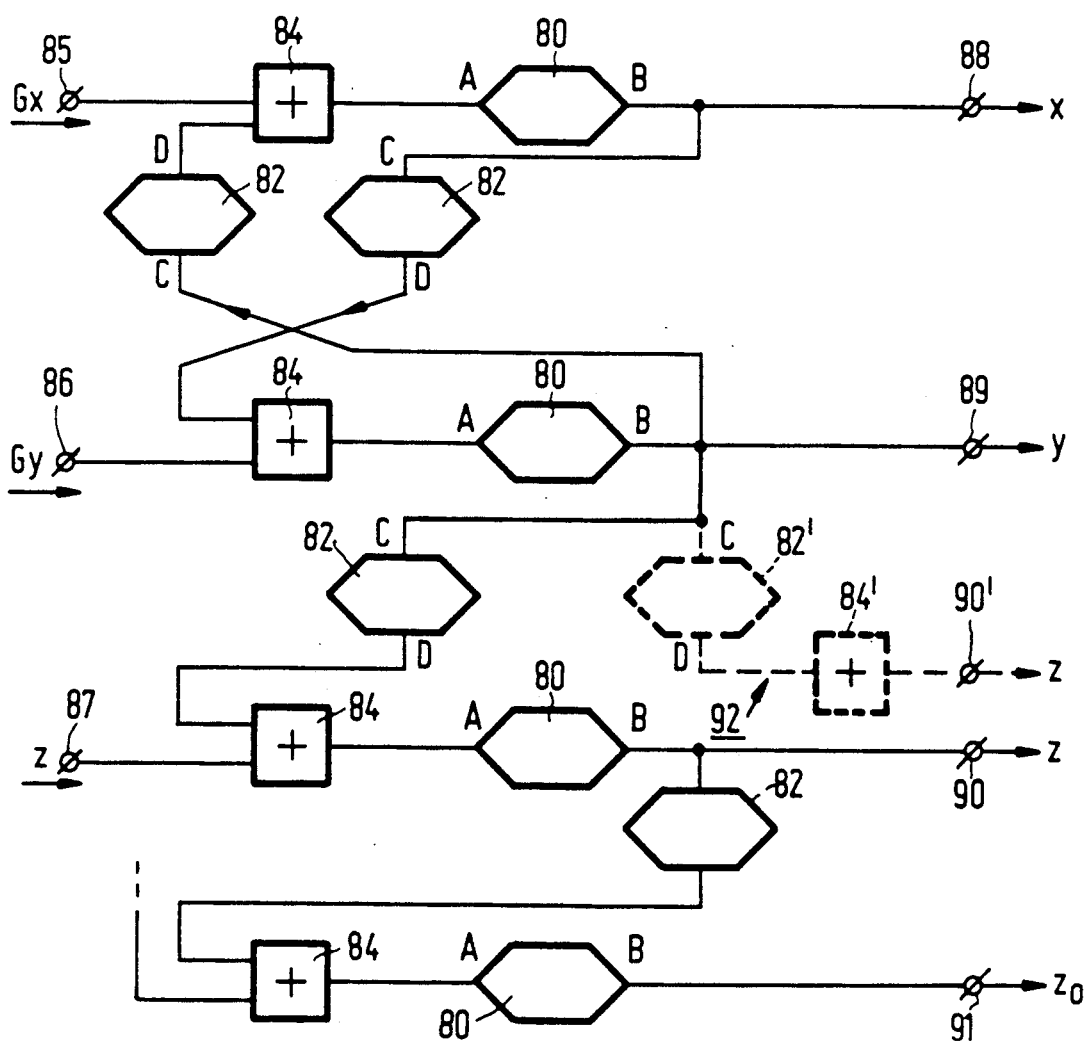

FIG. 2c shows an example of a circuit diagram for realizing higher-order correction signals, notably mixed correction signals, i.e. correction signals for gradient field orientations which deviate from that of the controlled gradient field. To achieve this, the circuit is composed of correction circuits 80 each similar to the circuit shown in FIG. 2a and connected between terminals A and B correction circuits 82 each similar to the circuit shown in FIG. 2b connected between terminals C and D, signal summing devices 84, input terminals 85, 86 and 87 for respective X-gradient, Y-gradient and Z-gradient input signals, output terminals 88, 89 and 90 for respective outputting corrected signals for X, Y and Z-control, and a terminal 91 for outputting a signal Z or other control signals.

A loop 92 comprising a circuit 82' corresponding to circuit 82 connected between terminals C-D and a summing device 84' is denoted by broken lines in order to indicate that it is optional. Using the linear response theory and Laplace transforms, such a switching circuit can be exactly defined on the basis of a model of coupled coils. The number of terms of the polynomial is co-determined by the magnitude and structure of the eddy current behavior.

What is claimed is:

1. A method for compensating for object eddy current effects produced by magnetic fields in a magnetic resonance apparatus comprising:

measuring first rf resonance signals generated in response to a non-compensated gradient field applied to a measurement object occupying a space of a volume of interest within a measurement space of the apparatus;

measuring second rf resonant signals generated by said object in said measurement space in response to magnetic field phenomena in said measurement space in the absence of said gradient field;

comparing the first and second resonant signals; and generating correction signals manifesting errors due to said field phenomena for said non-compensated gradient field to compensate for said eddy current effects on said object.

2. A method as claimed in claim 1, wherein the non-compensated eddy current behavior is measured by measuring, at different instants t after a gradient field transition, the decay behavior from free induction decay or echo signals generated by an rf pulse generated at an area of the measurement object.

3. A method as claimed in claim 2, characterized in that from measurements of an eddy current behavior there is determined the magnitude of additional continuous gradient fields required to reduce an eddy current effect to a value below an adjusted value at a desired instant t after a gradient field transition.

4. A method as claimed in claim 3, characterized in that correction signals for gradient field correction of gradient fields having a different symmetry are also derived from eddy current behavior measurements of a gradient field transition for a first gradient field symmetry.

5. A method as claimed in claim 4, characterized in that an eddy current behavior is measured in a corresponding manner from an eddy current compensated gradient field control signal, compensating gradient field control signals being determined on the basis thereof.

6. A method as claimed in claim 1 wherein from measurements of an eddy current behavior there is determined the magnitude of additional continuous gradient fields required to reduce an eddy current effect to a value below an adjusted value at a desired instant t after a gradient field transition.

7. A method as claimed in claim 1 wherein correction signals for gradient field correction of gradient fields having a different symmetry are also derived from eddy current behavior measurements of a gradient field transition for a first gradient field symmetry.

8. A method as claimed in claim 1 wherein an eddy current behavior is measured in a corresponding manner from an eddy current compensated gradient field control signal, compensating gradient field control signals being determined on the basis thereof.

9. An apparatus for compensating for object eddy current effects produced by magnetic fields in a magnetic resonance apparatus comprising:
   means for measuring first rf resonance signals generated in response to a non-compensated gradient field applied to a measurement object occupying a space of a volume of interest within a measurement space of the apparatus;
   means for measuring second rf resonant signals generated by said object in said measurement space in response to magnetic field phenomena in said measurement space in the absence of said gradient field;
   means for comparing the first and second resonant signals; and
   means for generating correction signals manifesting errors due to said field phenomena for said non-compensated gradient field to compensate for said eddy current effects on said object.

10. A magnetic resonance apparatus as claimed in claim 9 wherein said apparatus includes a control device for gradient fields comprising current control elements adapted to produce correction signals which exponentially decrease as regards initial values and time constants.

11. A magnetic resonance apparatus as claimed in claim 10, characterized in that it includes a measurement device for measuring free induction decay resonance signals, a signal processing device for converting these signals into exponentially decreasing correction signals, and switching circuits which are suitable for generating said correction signals.

12. A magnetic resonance apparatus as claimed in claim 11, characterized in that the signal processing device comprises means for calculating correction signals for gradient fields of different symmetry from an applied gradient field transition for a first gradient field symmetry.

13. A magnetic resonance apparatus as claimed in claim 12, characterized in that a signal processing device comprises means for determining gradient field control correction signals which also contain cross terms and higher order terms.

14. A magnetic resonance apparatus as claimed in claim 9 wherein said means for determining includes a measurement device for measuring free induction decay resonance signals, a signal processing device for converting these signals into exponentially decreasing correction signals, and switching circuits for generating said correction signals.

15. A magnetic resonance apparatus as claimed in claim 14 wherein the signal processing device comprises means for calculating correction signals for gradient fields of different symmetry from an applied gradient field transition for a first gradient field symmetry.

16. A magnetic resonance apparatus as claimed in claim 14 wherein the signal processing device comprises means for determining gradient field control correction signals which also contain cross terms and higher order terms.

* * * * *